United States Patent
Leydier et al.

(10) Patent No.: US 7,881,894 B2
(45) Date of Patent: Feb. 1, 2011

(54) METHOD AND CIRCUIT FOR LOCAL CLOCK GENERATION AND SMARTCARD INCLUDING IT THEREON

(75) Inventors: Robert Leydier, Meudon (FR); Alain Pomet, Rousset (FR); Benjamin Duval, Saint-Maximin (FR)

(73) Assignees: Gemalto SA, Meudon (FR); STMicroelectronics, SA, Montrouge (FR)

( * ) Notice: Subject to any disclaimer, the term of this patent is extended or adjusted under 35 U.S.C. 154(b) by 291 days.

(21) Appl. No.: 12/089,897

(22) PCT Filed: Jun. 10, 2006

(86) PCT No.: PCT/IB2006/002860

§ 371 (c)(1),
(2), (4) Date: Apr. 10, 2008

(87) PCT Pub. No.: WO2007/042928

PCT Pub. Date: Apr. 19, 2007

(65) Prior Publication Data

US 2008/0231328 A1     Sep. 25, 2008

(30) Foreign Application Priority Data

Oct. 10, 2005     (EP)     ................................. 05292108

(51) Int. Cl.
*G06F 1/04*     (2006.01)
(52) U.S. Cl. .................. 702/89; 327/105; 327/565; 327/295; 327/141; 327/167; 327/262; 327/263; 331/57; 331/172; 331/25

(58) Field of Classification Search .................. 702/89; 327/105, 565, 295, 2, 141, 161, 163, 261, 327/270, 167, 262, 263; 331/57, 172, 177 R, 331/34, 25, 167

See application file for complete search history.

(56) References Cited

U.S. PATENT DOCUMENTS

| | | | | |
|---|---|---|---|---|
| 5,172,357 A * | 12/1992 | Taguchi | ................... | 369/47.28 |
| 5,563,554 A * | 10/1996 | Mizuno | ....................... | 331/57 |
| 5,708,381 A * | 1/1998 | Higashisaka | ................ | 327/276 |
| 5,970,110 A | 10/1999 | Li | | |
| 6,025,756 A * | 2/2000 | Miyabe | ....................... | 331/57 |
| 6,256,361 B1 * | 7/2001 | Mozetic et al. | ............. | 375/360 |
| 6,317,008 B1 * | 11/2001 | Gabara | .................... | 331/117 R |
| 6,617,936 B2 * | 9/2003 | Dally et al. | .................... | 331/57 |
| 6,861,916 B2 * | 3/2005 | Dally et al. | ................. | 331/172 |
| 6,924,705 B2 * | 8/2005 | Huang | ........................ | 331/10 |

(Continued)

*Primary Examiner*—Carol S Tsai
(74) *Attorney, Agent, or Firm*—Pehr B. Jansson; The Jansson Firm

(57) ABSTRACT

One delay circuit is inserted in open loop inside a clock recovery circuit for improving the accuracy of clock recovery. One oscillator signal $\phi(0)$ to $\phi(2^i-1)$ is provided with a basic Step of Time. A rational number of Step of Time corresponding to a bit-duration is measured inside a received flow of bits. The oscillator signal $\phi(0)$ to $j(2^i-1)$ is transformed into a clock signal CK having active edges of said clock signal in phase with at least one oscillator signal $\phi(0)$ to $\phi(2^i-1)$, two consecutive active edges being separated by a time duration proportional to the integer part of the number of Step of Time. A time delay is computed proportional to the fractional part of the number of Step of Time. The next active edge of the clock signal CK is delayed of said computed delay.

23 Claims, 5 Drawing Sheets

U.S. PATENT DOCUMENTS

| | | |
|---|---|---|
| 7,078,979 B2 * | 7/2006 | Dally et al. .................. 331/57 |
| 2001/0036240 A1 | 11/2001 | Gossmann et al. |
| 2002/0033738 A1 | 3/2002 | Saeki et al. |
| 2003/0106361 A1 | 6/2003 | Greidanus et al. |
| 2004/0148539 A1 | 7/2004 | Leydier et al. |
| 2005/0216780 A1 | 9/2005 | Sung et al. |

* cited by examiner

METHOD AND CIRCUIT FOR LOCAL CLOCK GENERATION AND SMARTCARD INCLUDING IT THEREON

BACKGROUND OF THE INVENTION

1. Field of the Invention

The invention relates to local clock generation. More particularly, the invention relates to the generation of an accurate clock with a low jitter in a chip, for example the chip of a smartcard supporting USB standard (Universal Serial Bus is defined by a set of specifications published by the USB Implementer Forum). But the invention can be applied to any chip that needs an accurate clock with a low jitter, which clock is recovered from a received stream of data.

2. Description of the Related Art

According to USB standard, any USB device, root hub, hub or peripheral, needs to comprise a clock generation circuit providing an accurate clock signal. The accurate clock signal is required for receiving and sending data. For portable devices like smartcards or Flash cards supporting USB, it is preferable to have an on-chip clock generation circuit.

Several problems occur when implementing such an accurate clock generation circuit inside an Integrated Circuit (IC) into a portable device. The problems are due to the fact that IC technology itself is not very accurate for clock generation. Commonly, without correction the timing precision is around 30%. There are also some constraints regarding the power consumption that has to be as low as possible.

Several solutions of clock generation are known for auto-calibrating an internal clock generation circuit using the received data stream. U.S. Pat. No. 6,343,364 ('364) discloses a circuit comprising a free-running high frequency oscillator coupled to a counter used as a programmable timing synthesizer in relation with the received data stream. In '364, the circuit is self-calibrated by counting the number of free-running oscillator cycles in a period of time corresponding to one or more bits of an USB downstream signal. The number of cycles is then used for programming an accurate clock synthesizer. This solution is well adapted for USB low-speed communication wherein a frequency accuracy of 1.5% is required.

U.S. patent application No. 2004/0148539 ('539) discloses an improvement for adapting '364 knowledge to USB full-speed communication. The improvement consists in using bit-patterns, called Start Of Frame (SOF), broadcasted periodically by the host to all full-speed devices. SOF time intervals have a precision higher than the bit rate precision.

In addition to the frequency accuracy, there is the need to minimize power consumption. Both '364 and '539 use a ring oscillator that provides a plurality of phase signals that provide the Step of Time equal to the period of the ring oscillator divided by the number of phase signals. The multi-phase oscillator can provide the same Step of Time as a conventional oscillator but it runs at a lower frequency and thus minimizes power consumption. Also, the oscillator enables a longer period of time to use larger capacitors and reduces parasitic effects partially responsible for the jitter.

In view of this prior art a problem still remains. In the worst case of the full-speed USB standard, the jitter should be reduced to ±1.5 ns on the transmitted data stream. To achieve this jitter tolerance on the data stream, a required tolerance on the jitter is 210 ps for the oscillator providing the USB clock signal. According to prior art, the Step of Time should be lower than the required jitter on the oscillator. This requirement needs to use a very high frequency in combination with a high number of phases and results in an important power consumption. Another solution is required for reducing the power consumption.

SUMMARY OF THE INVENTION

The invention adds at least one delay in open loop inside the clock recovery circuit for improving the accuracy of clock recovery. The added delay is shorter than the Step of Time of a known oscillator in such a way that the precision on the jitter is lower than the Step of Time. The added delay enables a higher precision on the granularity of the clock recovery circuit. Different improvements are also made for calibrating the added delay as a function of the Step of Time. The prior art circuits may also be combined with the invention to obtain a preferred embodiment.

According a first aspect, the invention is a method for generating a calibrated clock signal comprising successive active edges, in an integrated circuit. The method comprises the steps of: providing at least one oscillator signal having a basic Step of Time, said oscillator signal having oscillator periods corresponding to a free running frequency; measuring a rational number of Step of Time of a bit duration inside a received flow of bits; after each generation of an active edge of the calibrated clock signal, computing an integer number and a fractional number of Step of Time that corresponds to the separation time before the next active edge; transforming the oscillator signal into a clock signal having active edges of said clock signal in phase with at least one oscillator signal, two consecutive active edges being separated by a time duration proportional to the integer number of Step of Time; computing a time delay proportional to the fractional part of Step of Time corresponding to the fractional number of Step of Time; and delaying the next active edge of the clock signal of said computed delay, said next active edge being desynchronized from the at least one oscillator signal.

Preferentially, the delaying of the clock signal is made by providing a plurality of delayed signals. Each delayed signals is delayed from one to each other of an elementary delay, one of said plurality of delayed signals is selected for obtaining the calibrated clock signal.

The elementary delay is calibrated in a calibration mode including the following steps: measuring the maximum number of elementary delays that can be added for having a total delay inferior to the Step of Time; and storing the measured maximum number. The computing of the delay is made by the multiplication of the fractional number of Step of Time by the maximum number.

The measuring of the rational number of step of time is performed during the calibration mode by: measuring on a data bus the number of the oscillator periods between two bits separated by one or more bits in the received flow of bits; and computing the rational number by performing a division of the measured number of oscillator periods the number of separating bits.

According a second aspect, the invention is a clock recovery circuit for providing a calibrated clock signal. Said clock recovery circuit comprises a free running oscillator, a meter circuit, computing means, a signal synthesizer and a delay circuit. The free running oscillator provides at least one oscillator signal associated to the Step of Time. The meter circuit measures a bit duration inside a received flow of bits, said meter circuit providing a rational number of Step of Time. The computing means receives the rational number of Step of Time, and computes an integer and a fractional number of Step of Time between two consecutive active edges of the calibrated clock signal. The signal synthesizer provides, at an output, a clock signal having two consecutive active edges separated by the integer number of Step of Time, said active edges of the clock signal being synchronized on said at least one oscillator signal. The delay circuit is placed at the output of the signal synthesizer. Said delay circuit provides, at an output, the calibrated clock signal corresponding to the clock signal with an active edge delayed of the fractional number of Step of Time.

Preferentially, the delay circuit may comprise a plurality of elementary delay circuits serially connected, and a selection circuit for selecting a signal at the output of one of said elementary circuit, each elementary delay circuit delaying the signal of an elementary delay. The delay circuit may further comprise a calibration circuit, a register and a multiplier. The calibration circuit measures the maximum number of elementary delays that may delay the signal in the Step of Time. The register stores the maximum number. The multiplier multiplies the stored maximum number by the fractional part of Step of Time that represents the delay to apply by the delay circuit, an output of the multiplier being linked to the selection circuit.

According to another improvement, the delay circuit may comprise an additional elementary delay circuit delaying the signal of half an elementary delay, said additional elementary delay circuit being connected at the input of the first elementary delay circuit of the serially connected elementary delay circuits. The delay circuit may further comprise the same number of registers than a number of oscillators signals, said register being selectively connected to the multiplier.

According to a third aspect, the invention is an integrated circuit including an USB interface and a clock recovery circuit as previously defined, said clock recovery circuit providing the calibrated clock signal to the USB interface.

According to another aspect, the invention is a module for a smart card having an integrated circuit including a communication interface and the previously defined clock recovery circuit. Preferentially, the smart card has a body card and comprises a cavity, wherein the module is mounted into said cavity.

BRIEF DESCRIPTION OF THE DRAWINGS

The aspect and advantages of the invention will become more apparent upon reading the following detailed description and upon reference to the accompanying drawings, in which.

DETAILED DESCRIPTION OF THE INVENTION

The invention will be now described in relation to a smartcard including an USB interface for communicating. The invention can also be applied to other kinds of devices using other communication interfaces, but having equivalent characteristics that necessitate a high frequency and an accurate clock signal. For example, the invention could be used in a Flash Card supporting a plurality of communication protocols, such as USB or the like. Both full-speed and high-speed USB peripheral may benefit from this invention. In the case of high-speed devices, the calibration signal may be microframe broadcasted every $\frac{1}{8}^{th}$ of ms (125 µs) and have the same frame number eight times during each ms.

Figure 1:
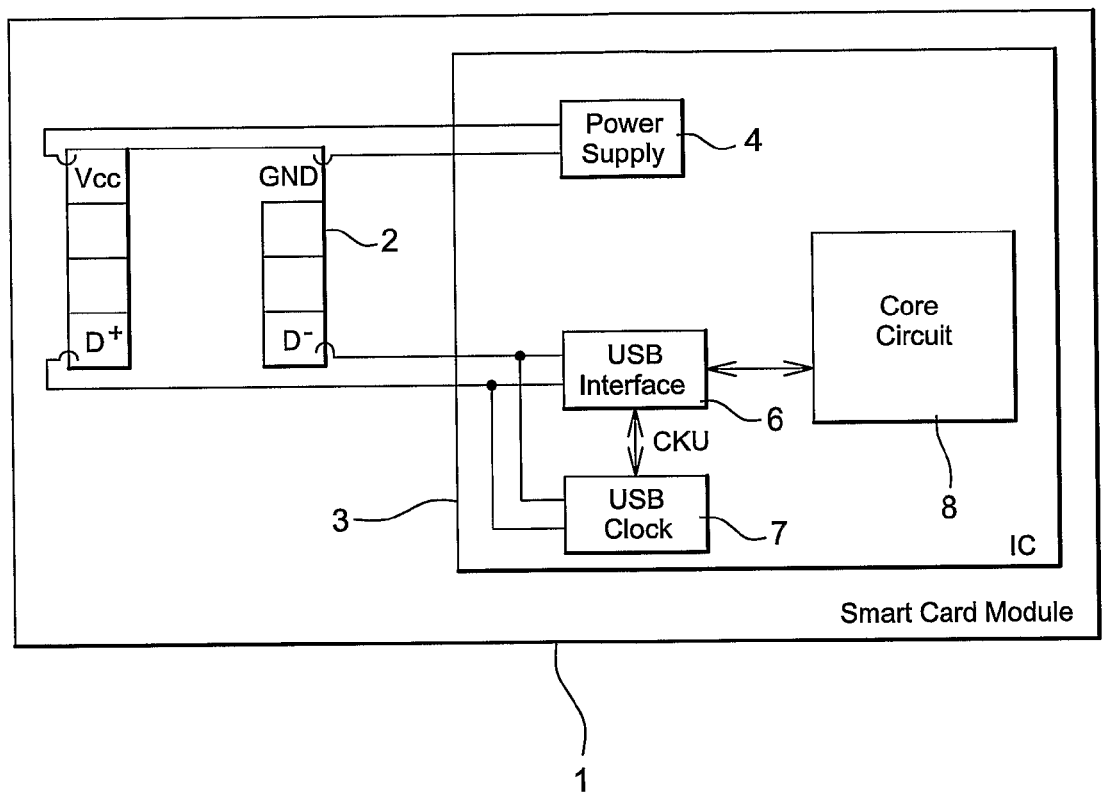
FIG. 1 shows a smart card module.

FIG. 1 shows a smart card module 1 to be inserted in a plastic body card of a smart card like a credit card or a SIM card. FIG. 1 corresponds to both the prior art and to the invention. The smart card module 1 comprises an ISO connector 2 linked to an Integrated Circuit (IC) 3. The ISO connector 2, for example, is compliant with ISO 7816-2, and comprises eight contact areas electrically linked to contact PADs of the IC 3. In the described embodiment, two contact areas VCC and GND are used for power supply. Two contact areas D+ and D− are used for the data bus of the USB protocol, according to standards ISO 7816-2 and 7816-12. Four contact areas are not used in the preferred embodiment but could be used for other interfaces.

The IC 3 comprises a power supply circuit 4, an USB interface 6, an USB clock circuit 7 and a core circuit 8. The supply circuit 4 is electrically linked to the contact areas VCC and GND for receiving power supply from the connector and for supplying all other circuits of the IC 3. The USB interface 6 is electrically linked to the contact areas D+ and D− and also to the core circuit 8. The USB interface 6 manages the communications between the core circuit 8 and a host connected through the connector 2. The USB clock circuit 7 is connected to the contact areas D+ and D− and to the USB interface 6. The USB clock circuit 7 provides an USB clock signal CKU to the USB interface 6. The USB clock signal CKU is calibrated using received message from the D+ and D− contact areas for having a clock signal compliant with USB specifications. The core circuit 8 is a processing circuit that may comprise a microprocessor and memories depending of the final use of the smart card. The smartcard module of FIG. 1 may correspond to a module of the prior art and to a module according to the invention. The sole difference between the prior art and the invention consists in the modification of the USB clock circuit 7.

Figure 2:
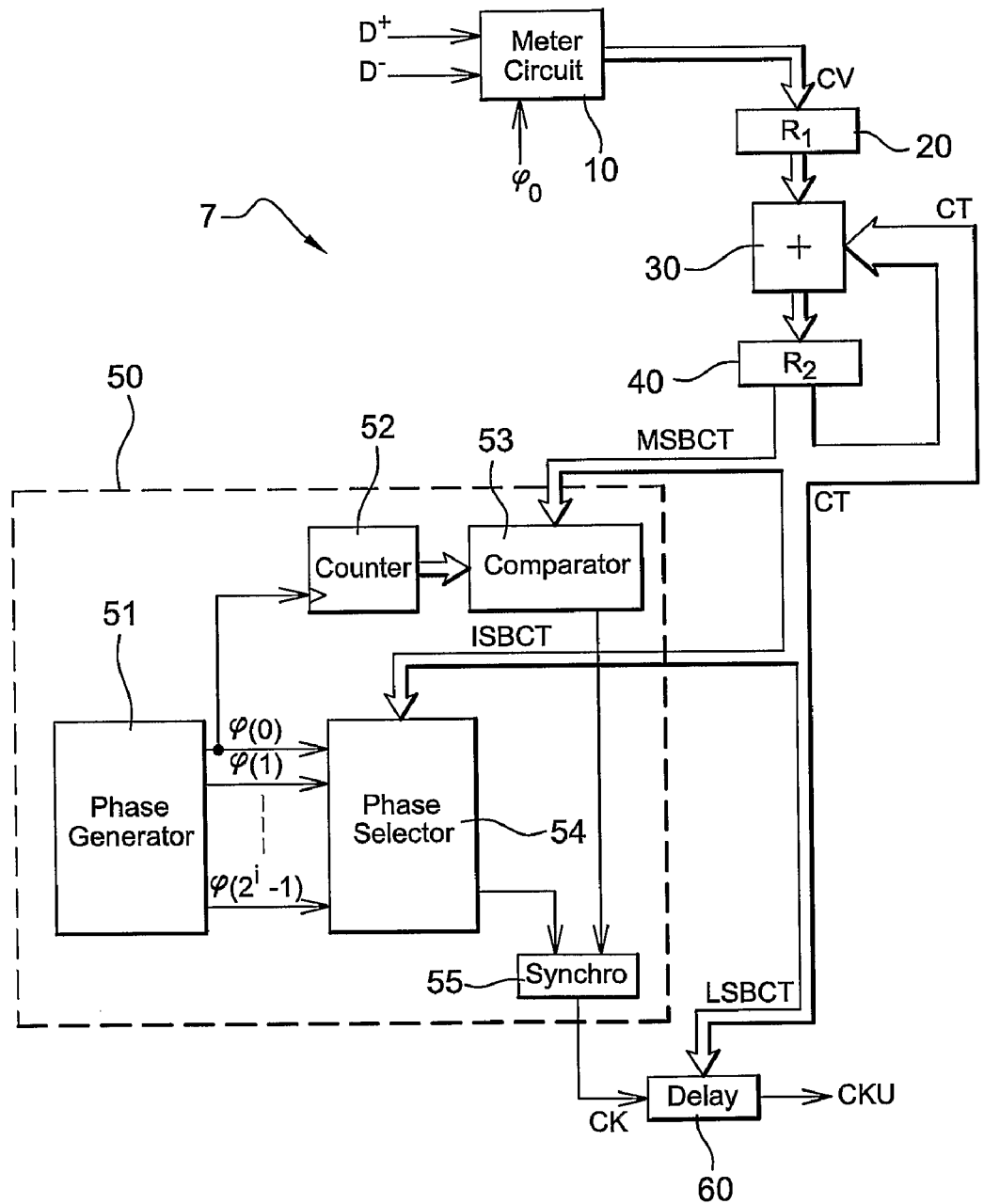
FIG. 2 shows a clock recovery circuit according to the invention.

FIG. 2 shows a preferred embodiment of the USB clock circuit 7 according to the invention, which comprises a meter circuit 10, a first register 20, an adder 30, a second register 40, a signal synthesizer 50 and a delay circuit 60. The meter circuit 10 is electrically connected to D+ and D− contact areas for receiving flow of data. This meter circuit 10 is constituted, for example, as disclosed in US2004/0148539 ('539) and provides as an output a calibrated value CV corresponding to an average number of Steps of Time in a transmitted bit period. The average number comprises an integer part and a fractional part for having a high precision.

The first register 20 is linked to the output of the meter circuit for memorizing the calibrated value when the meter circuit 10 has finished computing it. The adder 30 and the second register 40 constitute an accumulator. For each active edge of the USB clock signal CKU, said accumulator computes a counting value CT corresponding to the next theoretical position in time of an active edge of said USB clock signal CKU. The second register 40 memorizes the counting value CT that is incremented by the calibrated value CV in the adder 30 by adding the calibrated value CV to the previous counting value CT. The counting value is a rational number that comprises an integer part and a fractional part.

The signal synthesizer 50 provides a clock signal CK having an active edge timely spaced from the previous one proportional to the integer part of the counting value CT in relation to the Step of Time. Several embodiments are possible but preferentially, this signal synthesizer 50 is made according to prior art '539. The signal synthesizer 50 comprises a phase generator 51, a counter 52, a comparator 53, a phase selector 54 and a synchronization circuit 55.

The phase generator 51 is a free running oscillator, for example a ring oscillator that provides $2^i$ phase signals $\phi(0)$ to $\phi(2^i-1)$ of a same frequency, a same period T and equally spaced in time. The number of phase signals is preferably equal to a power of two for simplifying computation but another integer number of phase signals could be used. The time delay between two successive phase signals corresponds to the Step of Time of the synthesizer circuit 50. As an example, i is equal to three and the number of phase signals is then equal to eight.

One of the phase signals, for example $\phi(0)$, is used for clocking the counter 52. The comparator 53 receives the value from the counter 52 and the Most Significant Bits (MSBCT) of the counting value CT. The output of the comparator provide a first logic signal, for example equal to "zero", when the two compared values are unequal, and a second logic signal, for example equal to "one", when the two compared values are equal. The counter 52 and the comparator 53 act as a frequency divider that provide a signal having a frequency corresponding to the oscillator frequency of the phase generator 51 divided by MSBCT.

The phase selector 54 receives all phase signals $\phi(0)$ to $\phi(2^i-1)$ provided by the phase generator 51 and receives also i Intermediate Significant Bits (ISBCT) of the value CT for selecting one of the phase signals as a function of ISBCT. The selected phase signal is provided to the synchronization circuit 55 together with the output signal of the comparator 53. The synchronization circuit 55 provides, as its output, a clock signal CK corresponding to the signal outputted by the comparator 53 and having its active edge synchronized on the selected phase signal. MSBCT and ISBCT correspond to the integer part of CT in such a way that two successive active edges of the clock signal are timely separated by the Step of Time of the signal synthesizer multiplied by the integer part of CT. The time period between two active edges may vary by one Step of Time. The average time period will have the same precision of CT and that is compatible with USB specification. The selection of one phase from another creates a maximum jitter equal to one Step of Time.

The delay circuit 60 receives the clock signal CK and the Least Significant Bits (LSBCT) of the value CT, LSBCT corresponding to the fractional part of the value CT. The delay circuit 60 provides, as its output, the USB clock signal that corresponds to the clock signal CK delayed by a value proportional to LSBCT. The delay is a fractional part of the Step of Time. This added delay improves the position precision of the active edge of the USB clock signal CKU. The maximum jitter of the USB clock signal CKU is reduced to the fraction part of the Step of Time.

In USB full speed, the data clock is 12 MHz, which corresponds to a period of time of 83.3333 ns. Considering an oscillator frequency of 66 MHz ±30% on the time period, corresponding to a period T within the range 10 ns to 20 ns, the oscillator frequency being within the range 50 MHz to 100 MHz. With eight phase signals, the Step of Time is comprised between 1.25 ns and 2.5 ns. In USB standard, SOF token packets are sent every 1 ms with an accuracy of 0.05%. The accuracy of 0.05% on the received flow of bits corresponds to an error of at most 500 ns on the measured signal. In 1 ms, there are 12000 theoretical bits. The measurement of the calibration value is made according to the knowledge of '539 by counting the number N of periods T between two consecutive SOFs. This number N can be comprised, for example, between 49975 and 100050 due to the 30% of accuracy of the oscillator 51 and to the 0.05% on the SOF. This number N is measured with an accuracy lower than 20 ns/(1 ms-500 ns)~$2 \cdot 10^{-5}$. The period of time between consecutive SOF is known with an error mainly due to the accuracy of 500 ns. But various other contributions to global error must be taken into account and the global error should be considered around 550 ns.

The calibrated value CV, memorized in the first register 20, is divided by 12000 (the number of bits in 1ms) and multiplied by 8 (the number of phases in an oscillator time period). The calibration value CV is known in a rational number of Steps of Time. The maximum error of 550 ns is also divided by 12000 and multiplied by 8 and corresponds to an error of 46 ps on the calibrated value CV. The calibrated value CV is comprised theoretically within a range limited by 33.32 and 66.7 numbers of Step of time. The integer part is encoded on 7 bits and only the more significant bits of the fractional part are kept. The choice for making the division and the choice of the number of bits for the fractional part of the calibrated value have repercussions on the accuracy.

In a preferred embodiment, the division by 12000 is transformed in a multiplication by $12000^{-1}$. The multiplication by $12000^{-1}$ is approximated and truncated at $2^{-27}$ and causes an error of 8 ps on the calibrated value for the duration of one bit.

For reducing the size of component, it is necessary to limit the number of bits in registers. The fractional part can be, for example limited to ten bits. This truncation contributes to the bit duration error with an addition of 2 ps. The total maximum error for one bit is 56 ps (46+8+2) compared to a theoretical bit duration of 83.333 ns (12 MHz); such an error corresponds to less than 0.07%.

The MSBCT comprises the four most significant bits of CT, the ISBCT comprises the three next significant bits of CT, and LSBCT comprises the ten least significant bits, LSBCT also corresponding to the fractional part of CT. The counter 52 and the comparator 53 can be sized to a maximum capacity of four bits because a modulus operation can be perform for the comparison without impacting the precision.

First, lets assume that the delay circuit 60 is perfect for explaining the functioning of the USB clock circuit 7. It is considered that the delay introduced by the delay circuit is exactly proportional to the Step of Time multiplied by the fractional value corresponding to LSBCT.

A numerical example will now clarify the functioning. For example, considering that the real oscillator period is 62.5 MHZ with an exact frequency of 12 MHz for the bit rate, the Step of Time is equal to 2 ns while the bit period is 83.3333 ns. The measured number of oscillator periods in 1 ms is equal to 62500; the corresponding calibrated value stored in the first register is 41.666. The memorized calibrated value is equal to 0101001.1010101010 in binary code, the dot materializing the separation between the integer part and the fractional part.

A first active edge of the USB clock signal is provided at $t_0=0$. The next active edge is provided at $t_1=41.666$*(Step of Time)=83.332 ns and the $n^{th}$ active edge is provided at $t_n=n$*41.666*(Step of Time). It also appears that the accuracy on the average value of the frequency is the same as possible in the prior art and corresponds to the error on the memorized calibrated value that is less than 0.07% in this example. Concerning the jitter, a perfect delay circuit 60 suppresses the part due to the integer value in the prior art, and only the part of the jitter due to the error is taken into consideration, i.e. less than 56 ps.

Figure 3:
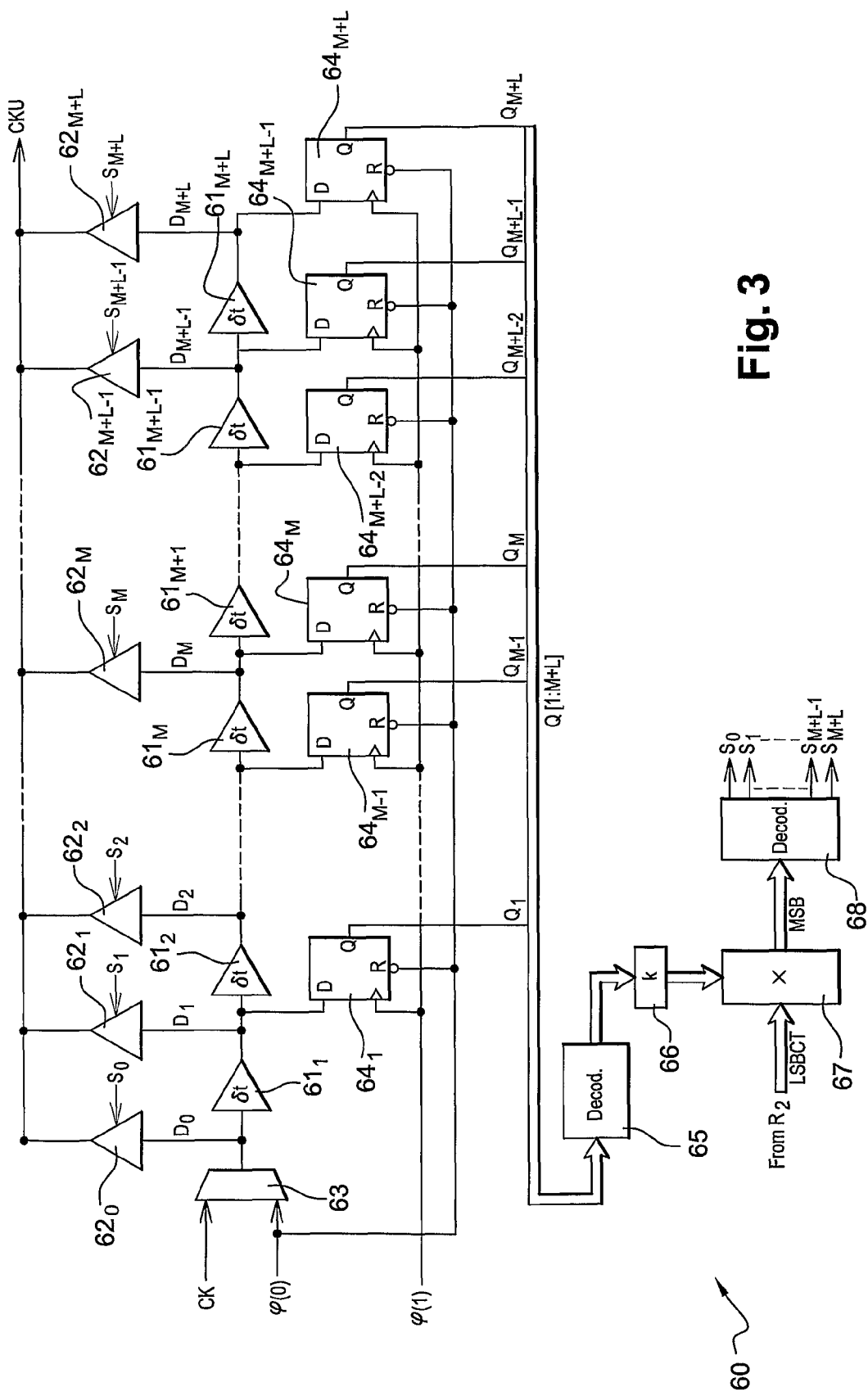
FIG. 3 shows a first delay circuit according to the invention.

But the delay circuit 60 is not perfect and depends on its realization mode. FIG. 3 shows a first preferred embodiment of the delay circuit 60. The delay circuit 60 comprises M+L elementary delay circuits 61, labeled $61_1$ to $61_{M+L}$, serially connected. All the elementary delay circuits 61 are identically made and are located close to each other on the IC substrate in such a way each delay can be considered identical to any other. Each elementary delay circuit 61 provides as its output a signal corresponding to its input signal delayed of by an elementary delay δt. The elementary delay δt is nominally set to the Step of Time divided by the number M. In the worst case, the number L corresponds to the number of elementary delay δt to add for having δt*(M+L) equal to the Step of Time. The value of L depends on M and on component dispersion. The dispersion on the value of the Step of Time is within ±30% range and the dispersion on the delay value is also, for example, within ±30% range. These two dispersions are partly linked but it is preferable to consider a worst case where these two dispersions are uncorrelated. The Step of Time is considered with an error of ±30% and the elementary delay δt with an error of −30%. So it is preferable to have L=0.86*M rounded to the upper integer.

For selecting the time delay, the delay circuit 60 comprises M+L+1 pass gate 62, labeled $62_0$ to $62_{M+L}$. Each pass gate 62 comprises a signal input, an output and a control input. The outputs of all pass gates 62 are connected together and constitute the output of the delay circuit 60. The signal inputs of the pass gates $62_1$, to $62_{M+L}$ are respectively connected to the outputs of the elementary delay circuits $61_1$ to $61_{M+L}$. The signal input of the pass gate $62_0$ is connected to the input of the elementary delay circuit $61_0$. The control input of each pass gate $62_0$ to $62_{M+L}$ receives respectively a control signal $S_0$ to $S_{M+L}$. Only one of the control signals can be active at a time.

A multiplexer 63 is connected at the input of the first elementary delay circuit $61_1$ for providing the clock signal CK in a functioning mode, or a phase signal φ(0) during a calibration mode. For calibrating the elementary delays 61, D-latches 64 are used. All the D-latches 64 are reset by the phase signal φ(0) received by the elementary delay circuits 61 during the calibration mode and are clocked by the next phase signal φ(1). The number of D-latches 64 is for example equal to M+L and the data input of each D-latch $64_1$ to $64_{M+L}$ is respectively connected to the output of each elementary delay circuit $61_1$ to $61_{M+L}$. The outputs $Q_1$ to $Q_{M+L}$ of the D-latches $64_1$ to $64_{M+L}$ are grouped in an output bus Q[1:M+L].

For reducing the number of D-latches 64 it is possible to keep only L+L' D-latches, with L' corresponding to the maximum D-latches used in a worst case when the Step of Time is −30% and the elementary delay δt is +30%, this corresponding to L'=0.47 M rounded to the upper integer. The first M−L' D-latches can then be suppressed.

A first decoder 65 receives the output bus Q[1:M+L] and provides a value k representative of the number of outputs active simultaneously. This value k is stored in a third register 66.

For determining the selected output of elementary delay circuit 61, during the functioning mode, the delay circuit 60 comprises a multiplier 67 and a second decoder 68. The multiplier receives LSBCT as one input and the value k as another input. The most significant bits of the result are provided to the decoder 68, which activates the control signal $S_i$ corresponding to these most significant bits.

In functioning mode, the delay introduced by the delay circuit 60 corresponds to k*LSBCT*δt, where k*δt=Step of Time rounded to the inferior δt and LSBCT is a binary number representing the above mentioned fractional number. The jitter introduced by the delay circuit is due to the calibration (rounding of k*δt) and to the resolution of LSBCT. For more details, it is preferable to explain how the delay circuit 60 is calibrated and then how it works.

Figure 4:
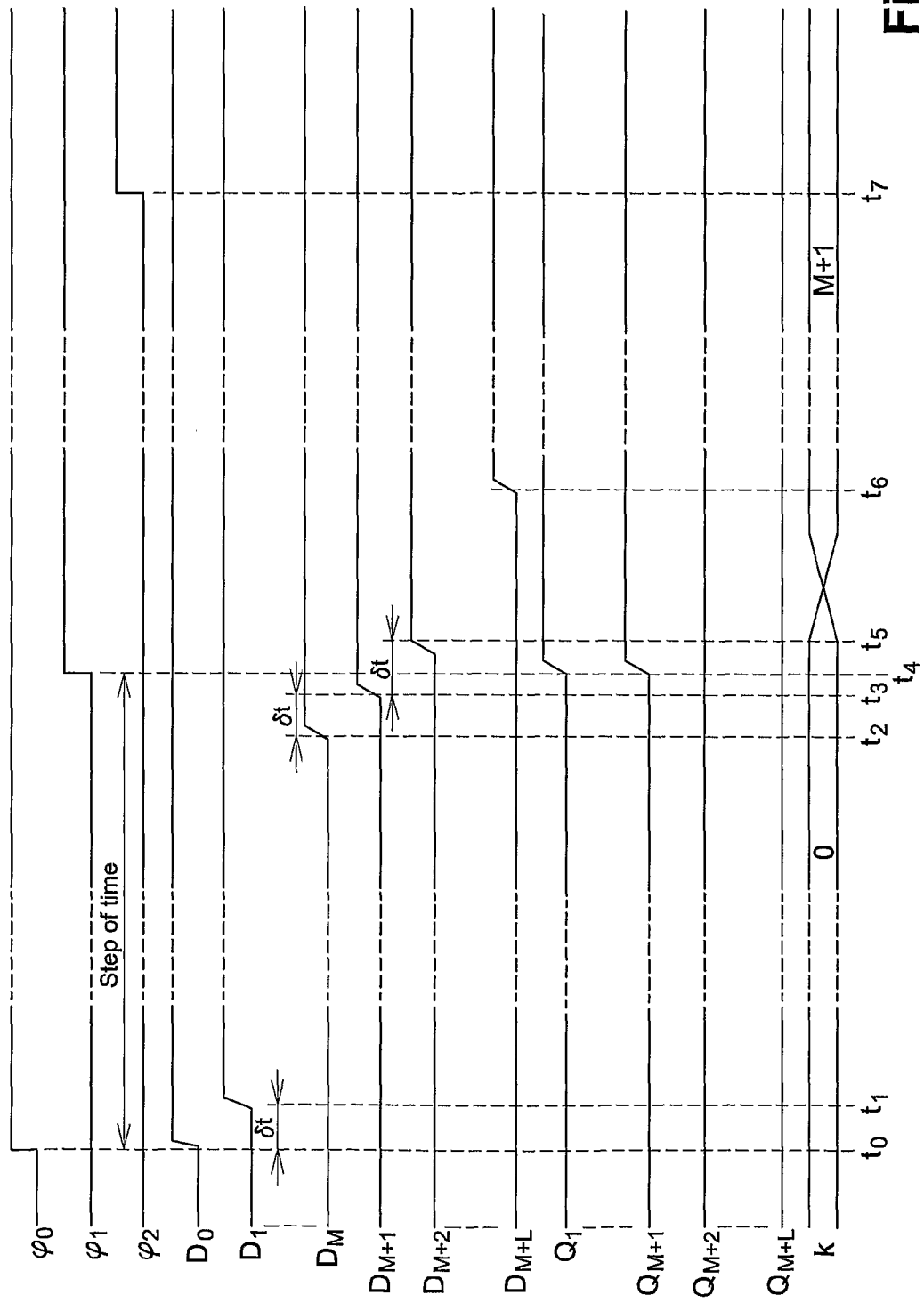
FIG. 4 shows chronograms explaining the calibration of the delay circuit.

The calibration is explained in relation to the chronograms of FIG. 4. In calibration mode, the multiplexer 63 provides a phase signal φ(0) to the input of the first elementary delay circuit $61_1$. The instant $t_0$ corresponds to a transition edge of phase signal φ(0). Before $t_0$, the phase signal φ(0) was at a low level and has reset all D-latches $64_1$ to $64_{M+L}$, so all the D-latch outputs are equal to the low level and the value k is equal to zero.

At instant $t_0$, the phase signal φ(0) toggles to a high level. The time propagation of multiplexer 63 being neglected, signal $D_0$ toggles at the same time and follows phase signal φ(0). The signal $D_0$ is provided as the input of the first elementary delay circuit $61_1$, which provides as its output the signal $D_1$ corresponding to the signal $D_0$ delayed of δt. The instant $t_1$ (equal to $t_0$+δt) corresponds to the toggling of signal $D_1$. Then the signal $D_1$ is provided to the input of the second elementary delay circuit $61_2$, which provides signal $D_2$ to the third elementary delay circuit $61_3$ and so on.

FIG. 4 illustrates the instant $t_2$ showing the toggling of signal $D_M$, which corresponds to $D_0$ delayed of M*δt. The signal $D_M$ is provided to elementary delay circuit $61_{M+1}$, which provides signal $D_{M+1}$ that toggles at instant $t_3$.

Instant $t_4$ corresponds to the toggling of the phase signal φ(1), which is independent of the elementary delay circuits 61. The instant $t_4$ occurs one Step of Time after the instant $t_0$, and, for example, just after the toggling of signal $D_{M+1}$ but before the toggling of the next delay signal $D_{M+2}$. The phase signal φ(1) clocking the D-latches $64_1$ to $64_{M+L}$, the D-latches 64 sample their inputs for providing output signals corresponding to the input signals at this instant $t_4$. After $t_4$, the delayed signals $D_{M+2}$ to $D_{M+L}$ continues to toggle one after the other, each δt from $t_5$ to $t_6$, but without incidence on the output signals of the D-latches 64.

So at $t_4$, the outputs $Q_1$ to $Q_{M+1}$ toggle to a high level and the outputs $Q_{M+2}$ to $Q_{M+L}$ stay at a low level. This sampling provides new input values to the decoder 65, which outputs a new value k equal to the number of active signals on the output bus Q[1:M+L], in this example k=M+1. This new value can then be loaded in the register 66, for example at instant $t_7$ corresponding to the toggling of the next phase signal φ(2).

The value k corresponds to the maximum number of elementary delays δt that can be added to obtain a total delay inferior to the Step of Time. Such a measure is performed with a maximum error equal to one elementary delay δt.

In functioning mode, the delay introduced by the delay circuit 60 corresponds to LSBCT*k*δt. But only the most significant bits of the result are used for selecting the output of the elementary delay circuit 61. The number of bits used corresponds to the number of bits equal to the number of bits for encoding the value k and an error at most equal to one elementary delay δt can also be introduced, which depends of the truncating performed at the output of the multiplier 67. Considering the average frequency, the error introduced by the delay circuit 60 is null because this error is compensated by the accumulation made by the adder 30 and the register 40. But this error introduces jitter, which can be also equal to the one elementary delay δt. So the total maximum jitter is equal to 2*δt.

Consider, in this example M=32. So the nominal value of δt is fixed to the nominal value of the Step of Time divided by M. For a nominal oscillator frequency of 75 MHz with eight phase signals, the nominal Step of Time is equal to 1.667 ns and so the nominal elementary delay δt is set to 52 ps. As indicated before the elementary delay is designed with an accuracy of ±30% that can be taken into account for determining the maximum jitter added by the delay circuit 60 equal to 2*$δt_{Max}$=135 ps. So the total jitter is inferior to 192 ps.

Figure 5:
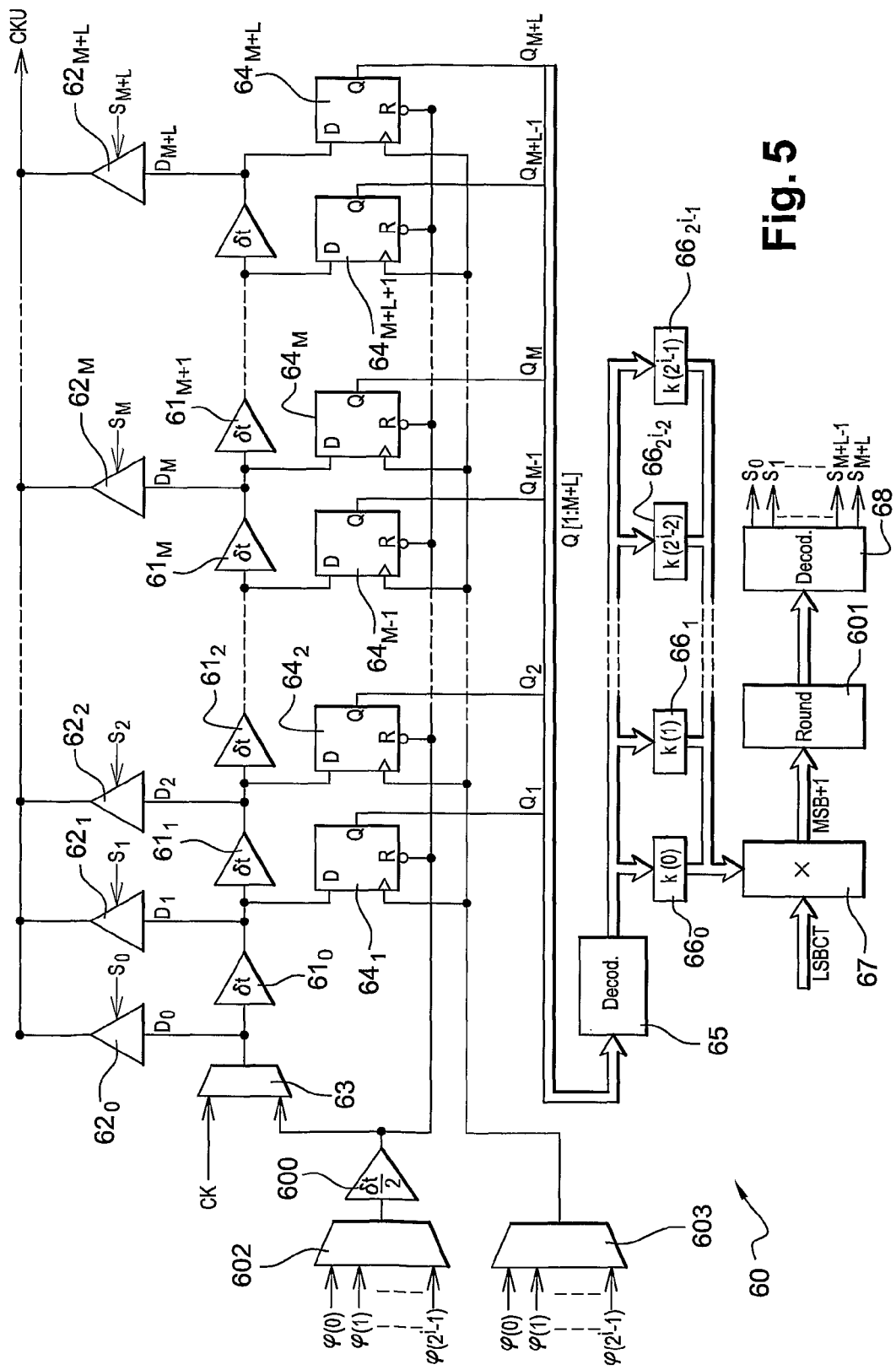
FIG. 5 shows a second delay circuit according to the invention.

FIG. 5 shows an improved embodiment of the delay circuit 60. In the delay circuit 60 shown in FIG. 5, three independent improvements are added.

A first improvement consists of the addition of a supplemental delay circuit 600. This supplemental delay circuit 600 is placed at the input of the multiplexer 63, which is used for receiving the phase signal during the calibration mode. The supplemental delay 600 is made with the same technology used for the elementary delay circuits 61 but it adds only a delay equal to half an elementary delay. Such a sizing can easily be made with a same proportion of error value, for example, an elementary delay may comprise four inverter gates serially connected and the supplemental delay may comprise only two inverter gates serially connected.

During the calibration mode, the clock signal is delayed by a half of elementary delay for providing a first delayed signal. The measurement of the number of delay is shifted by half an elementary delay. The measured number is then applied to the elementary delay circuits without the supplemental delay. The result is the measured number of delay circuits with a precision of ±½ elementary delay instead of an error comprises between 0 and −1 elementary delay circuit.

A second improvement is the addition of the rounding circuit 601 between the output of the multiplier 67 and the input of the second decoder 68. The multiplier has to provide one bit more than the necessary most significant bits needed for determining the pass gate $62_i$. This additional bit corresponds to the bit immediately lower than the necessary most significant bit. The rounding circuit 601 will add or not, one to the most significant bit depending on this additional bit such that the most significant bits provided to the second decoder 68 are rounded to the nearest value instead of truncated. This rounding circuit 601 reduces the errors due to the bit resolution, to an error equal to half an elementary delay.

With the simultaneous use of the first and second improvements, the resulting error on the jitter due to the delay circuit 60 becomes inferior to $\delta t_{Max}$=68 ps. So the total jitter is inferior to 125 ps. It is also possible to use a lower number of elementary delay circuits to achieve the same precision of the delay circuit shown in FIG. 3.

A third improvement regards the balance of the phase signals $\phi(0)$ to $\phi(2^i-1)$. Depending of the constitution of the phase generator, the phase signals $\phi(0)$ to $\phi(2^i-1)$ may have a balance error. The balance error itself adds a jitter. But if the elementary delay circuits are calibrated between two phase signals and used between two other phase signals the jitter due to the unbalanced phase signals is increased.

To overcome this drawback, several registers $66_0$ to $66_{2^i-1}$ are used for calibration of the elementary delay circuits 61 between each pair of consecutive phase signals. The registers $66_0$ to $66_{2^i-1}$ are connected in parallel between the output of the first decoder 65 and the input of the multiplier 67. Each register $66_i$ memorizes the maximum number of elementary delays corresponding to the associated pair of phase signals. During operation mode, the register corresponding to the phase signal selected by the phase selector is outputted to the multiplier 67. With such a calibration, the delay circuit 60 does not add jitter due to the unbalance of phase signals.

For calibrating the different values k(0) to $k(2^i-1)$, it is necessary to perform the calibration on each pair of phase signals. So, two multiplexers 602 and 603 are added for providing the phase signals during calibration mode. For memorizing the first value k(0), the register $66_0$ is selected, the first phase signal $\phi(0)$ is provided to the chain of elementary circuits 61, and the second phase signal $\phi(1)$ is provided for clocking the D-latches 64. The calibration can then be made as previously explained.

The operation is repeated with the selection of register $66_1$ for memorizing the second value k(1), the second phase signal $\phi(1)$ being provided to the elementary circuits 61, the third phase signal $\phi(2)$ clocking the D-latches 64. And so on, the calibration operations are repeated up to the selection of the last register $66_{2^i-1}$ for memorizing the last value $k(2^i-1)$, the last phase signal $\phi(2^i-1)$ being provided to the elementary circuits 61, the first phase signal $\phi(0)$ clocking the D-latches 64.

Many variations of the invention are possible. In particular, the present specification shows a specific embodiment of the delay circuit 60 well suited for the needs of the USB in a smartcard or a Flash Card communicating over USB. Other circuits that may perform the calibration of the delay circuits could replace the D-latches. Also, the elementary delay circuits are serially connected for minimizing the total circuit size, but another combination of delay circuits may have an equivalent function.

The invention claimed is:

1. A method for generating a calibrated clock signal (CKU) in an integrated circuit, the calibrated clock signal being suitable for input as a clock signal to a communications interface, the calibrated clock signal (CKU) having successive active edges, wherein the method comprises the steps of:

providing at least one oscillator signal ($\phi(0)$ to $\phi(2^i-1)$) having a basic Step of Time, said oscillator signal having oscillator periods corresponding to a free running frequency;

measuring an rational number of Step of Time of a bit duration inside a received flow of bits;

after each generation of an active edge of the calibrated clock signal, computing an integer number and a fractional number of Step of Time that corresponds to the separation time before the next active edge;

transforming the oscillator signal ($\phi(0)$ to $\phi(2^i-1)$) into a clock signal (CK) having active edges of said clock signal in phase with at least one oscillator signal ($\phi(0)$ to $\phi(2^i-1)$), two consecutive active edges being separated by a time duration proportional to the integer number of Step of Time;

computing a time delay proportional to the fractional part of Step of Time corresponding to the fractional number of Step of Time;

delaying the next active edge of the clock signal (CK) by said computed delay to produce the calibrated clock signal (CKU) wherein said next active edge being desynchronized from the at least one oscillator signal; and providing the calibrated clock signal (CKU) by clock recovery circuit to the communications interface.

2. The method of claim 1, wherein the delaying of the clock signal is made by providing a plurality of delayed signals ($D_0$ to $D_{M+L}$) each delayed signals being delayed from one to each other of an elementary delay, and by selecting one of said plurality of delayed signals for obtaining the calibrated clock signal (CKU).

3. The method of claim 2, wherein the elementary delay is calibrated in a calibration mode including the following steps:

measuring the maximum number (k) of elementary delays that can be added for having a total delay inferior to a Step of Time; and storing the measured maximum number (k), and wherein the computing of the delay is made by the multiplication of the fractional number of Step of Time by the maximum number.

4. The method of claim 3, wherein, in calibration mode, the clock signal is delayed of a half of elementary delay for providing a first delayed signal.

5. The method of claim 1 wherein the transforming of the oscillator signal comprises a frequency division.

6. The method of claim 5, wherein the providing of the oscillator signals comprises the providing of a plurality of oscillator signals ($\phi(0)$ to $\phi(2^i-1)$) of the same frequency but equally phase shifted, the Step of Time been sensibly equal to the separating time between two successive shifted oscillator signals; and wherein the transforming of the oscillator signal further comprises a selection of one of the oscillator signals, and a synchronization of the clock signal with said selected oscillator signal.

7. The method of claim 6, wherein the elementary delay is calibrated in a calibration mode including the following steps:—measuring the maximum number (k) of elementary delays that can be added for having a total delay inferior to a Step of Time, wherein the measuring of the maximum number ($k(0)$ to $k(2^i-1)$) is performed between each successively shifted oscillator signals ($\phi(0)$ to $\phi(2^i-1)$), wherein each the maximum numbers are stored in relation with a shifted oscillator signal, and wherein the computing of the delay is performed with the maximum number corresponding to selected oscillator signal used for the synchronization of the clock signal, and—storing the measured maximum number (k), and wherein the computing of the delay is made by the multiplication of the fractional number of Step of Time by the maximum number.

8. The method of claim 1 wherein the measuring of the rational number of step of time is performed during the calibration mode by:
measuring on a data bus the number of the oscillator periods between two bits separated by one or more bits in the received flow of bits;
computing the rational number by performing a division of the measured number of oscillator periods the number of separating bits.

9. A clock recovery circuit for providing a calibrated clock signal (CKU) comprising:
a free running oscillator providing at least one oscillator signal ($\phi(0)$ to $\phi(2^i-1)$) associated to a Step of Time;
a meter circuit for measuring a bit duration inside a received flow of bits, said meter circuit providing an rational number of Step of Time;
computing means receiving the rational number of Step of Time, and computing an integer number (MSBCT and ISBCT) and a fractional number (LSBCT) of Step of Time between two consecutive active edges of the calibrated clock signal;
a signal synthesizer for providing, at an output, a clock signal (CK) having two consecutive active edges separated by the integer number of Step of Time, said active edges of the clock signal (CK) being synchronized on said at least one oscillator signal ($\phi(0)$ to $\phi(2^i-1)$); and
a delay circuit placed at the output of the signal synthesizer, said delay circuit providing, at an output, the calibrated clock signal (CKU) corresponding to the clock signal with an active edge delayed of the fractional number of Step of Time.

10. The clock recovery circuit of claim 9, wherein, the delay circuit is independent of the oscillator.

11. The clock recovery circuit of claim 9, wherein the delay circuit comprises a plurality of elementary delay circuits serially connected, and a selection circuit for selecting a signal at the output of one of said elementary circuit, each elementary delay circuit delaying the signal of an elementary delay ($\delta t$).

12. The clock recovery circuit of claim 11, wherein the delay circuit further comprises
a calibration circuit for measuring the maximum number of elementary delays ($\delta t$) that may delay the signal in a Step of Time,
a register for storing the maximum number,
a multiplier for multiplying the stored maximum number by the fractional part of Step of Time that represents the delay to apply by the delay circuit an output of the multiplier being linked to the selection circuit.

13. The clock recovery circuit of claim 12, wherein the delay circuit comprises an additional elementary delay circuit delaying the signal of half an elementary delay, said additional elementary delay circuit being connected at the input of the first elementary delay circuit of the serially connected elementary delay circuits.

14. The clock recovery circuit of claim 9, wherein the signal synthesizer further comprises a programmable frequency divider connected to the free running oscillator said divider providing a primary clock signal.

15. The clock recovery circuit of claim 14, wherein the free running oscillator is a ring oscillator providing a plurality of oscillator signals ($\phi(0)$ to $\phi(2^i-1)$) of the same frequency but equally phase shifted;
wherein the frequency synthesizer further comprises a phase selector for selecting one of the oscillator signals ($\phi(0)$ to $\phi(2^i-1)$) of the ring oscillator and a synchronization circuit that synchronizes an active edge of the primary clock signal with the selected oscillator signal, said synchronization circuit providing the clock signal (CK); and
wherein the Step of Time is equal to the separating time between two successively shifted oscillator signals.

16. The clock recovery circuit of claim 9, wherein the meter circuit is linked to a data bus (D+, D−), said meter circuit including:
means for measuring on the data bus the number of the oscillator periods between two data separated by one or more data in a received flow of data;
means for computing the measured number of oscillator periods to obtain an average number of Steps of Time corresponding to the reference value.

17. The clock recovery circuit of claim 16, wherein the data bus is an Universal Serial Bus.

18. An integrated circuit, including an USB interface and a clock recovery circuit providing calibrated clock signal (CKU) to the USB interface, said clock recovery circuit comprising:
a free running oscillator providing at least one oscillator signal ($\phi(0)$ to $\phi(2^i-1)$) associated to a Step of Time;
a meter circuit for measuring a bit duration inside a received flow of bits, said meter circuit providing an rational number of Step of Time;
computing means receiving the rational number of Step of Time, and computing an integer number (MSBCT and ISBCT) and a fractional number (LSBCT) of Step of Time between two consecutive active edges of the calibrated clock signal;
a signal synthesizer for providing, at an output, a clock signal (CK) having two consecutive active edges separated by the integer number of Step of Time, said active edges of the clock signal (CK) being synchronized on said at least one oscillator signal ($\phi(0)$ to $\phi(2^i-1)$); and
a delay circuit placed at the output of the signal synthesizer said delay circuit providing, at an output, the calibrated clock signal (CKU) corresponding to the clock signal with an active edge delayed of the fractional number of Step of Time.

19. A module for a smart card having an integrated circuit including a communication interface and a clock recovery circuit comprising:
a free running oscillator providing at least one oscillator signal ($\phi(0)$ to $\phi(2^i-1)$) associated to a Step of Time;
a meter circuit for measuring a bit duration inside a received flow of bits, said meter circuit providing an rational number of Step of Time;
computing means receiving the rational number of Step of Time, and computing an integer number (MSBCT and ISBCT) and a fractional number (LSBCT) of Step of Time between two consecutive active edges of the calibrated clock signal;
a signal synthesizer for providing, at an output, a clock signal (CK) having two consecutive active edges separated by the integer number of Step of Time, said active edges of the clock signal (CK) being synchronized on said at least one oscillator signal ($\phi(0)$ to $\phi(2^i-1)$); and
a delay circuit placed at the output of the signal synthesizer said delay circuit providing, at an output, the calibrated clock signal (CKU) corresponding to the clock signal with an active edge delayed of the fractional number of Step of Time.

20. A smart card body and comprising:
a cavity; and
a module mounted in said cavity, said module having an integrated circuit including a communication interface and a clock recovery circuit comprising:
a free running oscillator providing at least one oscillator signal ($\phi(0)$ to $\phi(2^i-1)$) associated to a Step of Time;
a meter circuit for measuring a bit duration inside a received flow of bits, said meter circuit providing an rational number of Step of Time;
computing means receiving the rational number of Step of Time, and computing an integer number (MSBCT and ISBCT) and a fractional number (LSBCT) of Step of Time between two consecutive active edges of the calibrated clock signal;
a signal synthesizer for providing, at an output, a clock signal (CK) having two consecutive active edges separated by the integer number of Step of Time, said active edges of the clock signal (CK) being synchronized on said at least one oscillator signal ($\phi(0)$ to $\phi(2^i-1)$); and
a delay circuit placed at the output of the signal synthesizer, said delay circuit providing, at an output, the calibrated clock signal (CKU) corresponding to the clock signal with an active edge delayed of the fractional number of Step of Time.

21. The clock recovery circuit of claim 12 wherein the signal synthesizer further comprises a programmable frequency divider connected to the free running oscillator, said divider providing a primary clock signal.

22. The clock recovery circuit of claim 21 wherein the free running oscillator is a ring oscillator providing a plurality of oscillator signals ($\phi(0)$ to $\phi(2^i-1)$) of the same frequency but equally phase shifted;
wherein the frequency synthesizer further comprises a phase selector for selecting one of the oscillator signals ($\phi(0)$ to $\phi(2^i-1)$) of the ring oscillator and a synchronization circuit that synchronizes an active edge of the primary clock signal with the selected oscillator signal, said synchronization circuit providing the clock signal (CK); and
wherein the Step of Time is equal to the separating time between two successively shifted oscillator signals.

23. The clock recovery circuit of claim 22, wherein the delay circuit further comprises the same number of registers than the number of oscillators signals ($\phi(0)$ to $\phi(2^i-1)$) selectively connected to the multiplier.

* * * * *